United States Patent
Chang et al.

(10) Patent No.: US 8,035,457 B2
(45) Date of Patent: Oct. 11, 2011

(54) VOLTAGE CONTROLLED OSCILLATOR

(75) Inventors: Chih-Hsiang Chang, Taichung (TW); Jung-Mao Lin, Taichung (TW); Ching-Yuan Yang, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/687,891

(22) Filed: Jan. 15, 2010

(65) Prior Publication Data

US 2011/0018645 A1    Jan. 27, 2011

(30) Foreign Application Priority Data

Jul. 23, 2009    (TW) .............................. 98124898 A

(51) Int. Cl.
*H03B 5/08*    (2006.01)

(52) U.S. Cl. .............. 331/167; 331/117 R; 331/117 FE; 331/185

(58) Field of Classification Search .................. 331/167, 331/117 R, 117 FE, 185

See application file for complete search history.

(56) References Cited

U.S. PATENT DOCUMENTS

| | | | |
|---|---|---|---|
| 7,038,527 B2 | 5/2006 | Titus et al. | |
| 7,064,622 B2 | 6/2006 | Jasa et al. | |
| 7,132,901 B2 | 11/2006 | Cojocaru | |
| 7,554,416 B2 | 6/2009 | Lee et al. | |
| 7,902,930 B2 * | 3/2011 | Lee et al. | 331/46 |

OTHER PUBLICATIONS

Deyi Pi et al., "A 2.5-31 GHz CMOS Differentially-Controlled Continuously-Tuned Varactor-Less LC-VCO," IEEE Asian Solid-State Circuits Conference, Korea, pp. 111-114, Nov. 2007.
Jing-Hong Conan Zhan et al., "A 25-GHz Emitter Degenerated LC VCO," IEEE Journal of Solid-State Circuits, vol. 39, No. 11, pp. 2062-2064, Nov. 2004.
Chih-Hsiang Chang, Ching-Yuan Yang, "A 0.18-um CMOS 16-GHz Varactorless LC-VCO with 1.2-GHz Tuning Range", IEEE Asian Solid-State Circuits Conference (A-SSCC), Korea, pp. 107-110, Nov. 2007.
C.-Y. Wu and C.-Y. Yu, "Design and analysis of a millimeter-wave direct injection-locked frequency divider with large frequency locking range", IEEE Trans. Microw. Theory Tech., vol. 55, No. 8, pp. 1649-1658, Aug. 2007.
"Office Action of Taiwan Counterpart Application" issued on Jun. 22, 2011, p1-p-10, in which the listed references were cited.

* cited by examiner

*Primary Examiner* — Arnold Kinkead
(74) *Attorney, Agent, or Firm* — Jianq Chyun IP Office

(57) ABSTRACT

A voltage controlled oscillator (VCO) includes a voltage controlled current source (VCCS), a negative resistance circuit (NRC), a first transformer, a second transformer, a first transistor and a second transistor. A current terminal of the VCCS receives a control voltage. First terminals of first and second current paths in the NRC are coupled to a current terminal of the VCCS. Primary sides of the first and the second transformers are respectively coupled to second terminals of the first and the second current paths. Secondary sides of the first and the second transformers are first and second output terminals of the VCO, respectively. First terminals of the first and the second transistor are respectively coupled to the secondary sides of the first and the second transformers. Control terminals of the first and the second transformers are respectively coupled to the primary sides of the first and the second transformers.

17 Claims, 9 Drawing Sheets

VOLTAGE CONTROLLED OSCILLATOR

CROSS-REFERENCE TO RELATED APPLICATION

This application claims the priority benefit of Taiwan application serial no. 98124898, filed on Jul. 23, 2009. The entirety of the above-mentioned patent application is hereby incorporated by reference herein and made a part of specification.

BACKGROUND

1. Technical Field

The present invention generally relates to an oscillator, and more particularly, to a wide bandwidth voltage controlled oscillator using a negative resistance technique.

2. Description of Related Art

In recent years, due to the development of the wireless communication, the manufacturing technology of integrated circuit (IC) has a violent variation within a short time, especially for the circuit of the transmitter applied in radio frequency (RF). With rapid progress in semiconductor manufacturing technology, the current application of IC at Giga Hertz becomes wider and wider, and even progresses to higher operation frequency. Accordingly, the design of the circuit of the transmitter is more difficult and has more challenges. A voltage controlled oscillator (VCO) plays an important role in the front end RF circuit. The VCO is mainly used in the frequency synthesizer to provide a stable and variable reference frequency in RF system.

In IC design, an LC-VCO is designed generally with the configuration of negative resistance, and the frequency of the LC-VCO is changed with a variable capacitor. The oscillation frequency $f_{OSC}$ of the LC configuration thereof is determined according to the equation $f_{OSC}=1/(2\pi\sqrt{LC})$. From this equation, only the inductance L and the capacitance C can be changed to tune the oscillation frequency $f_{OSC}$. FIG. 1 illustrates a conventional VCO 100 using a negative resistance circuit (NRC). Transistors $M_{n1}$ and $M_{n2}$ form the NRC. In FIG. 1, $C_V$ represents a variable capacitor, $C_0$ represents an invariable capacitor, and $C_P$ represents a parasitic capacitor. By using the mutual resonance of the inductor and the capacitor, the inductor and the varactor can serve as the oscillation frequency of the circuit. The oscillation frequency $f_{OSC}$ thereof is determined according to the equation $$f_{OSC} = \frac{1}{2\pi\sqrt{L\times(C_0+C_P+C_V)}}.$$

Conventionally, the chip inductor adopted in the high frequency IC is a helical inductor realized in metal layers. Because the inductance of the inductor L is hard to be changed, the conventional VCO 100 includes a capacitance device related to voltage characteristic—the variable capacitor $C_V$. By adjusting the variable capacitor $C_V$, the oscillation frequency $f_{OSC}$ is changed, and all kinds of required frequency specifications are synthesized. Besides the variable capacitor $C_V$, the equivalent capacitor of the conventional VCO 100 includes the practical parasitic capacitor $C_P$ and the invariable capacitor $C_0$. Accordingly, the entire tuning range is determined by the proportion of the capacitance of the variable capacitor $C_V$ relative to all of the equivalent capacitance in the VCO 100. Unfortunately, for some capacitance, if the VCO is desired to operate at high frequency, the equivalent resonance capacitor requires being relatively reduced. Because the practical parasitic capacitor $C_P$ is generally inevitable, and it is required to reduce the total equivalent capacitance, the proportion of the capacitance of the variable capacitor $C_V$ relative to all of the equivalent capacitance is reduced. Accordingly, the variable range (i.e. the tuning range) of the oscillation frequency $f_{OSC}$ is limited. In other words, in order to maximize the tuning range, the variable range of the capacitance of the variable capacitor $C_V$ requires being increase. However, it may reduce the oscillation frequency $f_{OSC}$ because the total equivalent capacitance become larger. Therefore, these issues are traded off between the oscillation frequency $f_{OSC}$ and the tuning range. In the design of high frequency circuit, it is affected considerably.

SUMMARY

One embodiment of the invention provides a voltage controlled oscillator (VCO). The VCO includes a first voltage controlled current source (VCCS), a first negative resistance circuit (NRC), a first transformer, a second transformer, a first transistor, and a second transistor. The first VCCS has a control end and a current end, wherein the control end receives a control voltage. The first NRC has a first current path and a second current path, wherein first ends of the first and the second current paths are coupled to the current end of the first voltage controlled current. The first transformer has a primary side and a second side, wherein the primary side is coupled to a second end of the first current path in the first NRC, and the secondary side serves as a first output end of the VCO. The second transformer has a primary side and a second side, wherein the primary side is coupled to a second end of the second current path in the first NRC, and the secondary side serves as a second output end of the VCO. A first end of the first transistor is coupled to the secondary side of the first transformer, and a control end of the first transistor is coupled to the primary side of the first transformer. A first end of the second transistor is coupled to the secondary side of the second transformer, and a control end of the second transistor is coupled to the primary side of the second transformer.

One embodiment of the invention provides a voltage controlled oscillator (VCO). The VCO includes a first voltage controlled current source (VCCS), a first negative resistance circuit (NRC), a first transformer, a second transformer, a first transistor, and a second transistor. The first VCCS has a control end and a current end, wherein the control end receives a control voltage. The NRC having a first current path and a second current path, wherein first ends of the first and the second current paths are coupled to a second voltage. The first transformer has a primary side and a second side, wherein the primary side is coupled to a second end of the first current path in the first NRC, and the secondary side serves as a first output end of the VCO. The second transformer has a primary side and a second side, wherein the primary side is coupled to a second end of the second current path in the first NRC, and the secondary side serves as a second output end of the VCO. A first end of the first transistor is coupled to the secondary side of the first transformer, a second end of the first transistor is coupled to the current end of the first VCCS, and a control end of the first transistor is coupled to the primary side of the first transformer. A first end of the second transistor is coupled to the secondary side of the second transformer, a second end of the second transistor is coupled to the current end of the first VCCS, and a control end of the second transistor is coupled to the primary side of the second transformer.

Base on the above, it is not required to adjust the frequency of the VCO by using the variable capacitor in the embodiment of the invention. Instead, the amount of the current of the resonance transistor is changed to adjust the frequency of the VCO. Accordingly, the limitation of the constant capacitor can be disregarded. The oscillation frequency can be highly increased by using the current tuned technique in the embodiment of the invention. Furthermore, the VCO of the embodiment of the invention does not require limiting to the oscillation frequency and the tuning range.

To make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

One embodiment of the invention provides a voltage controlled oscillator (VCO). Without the variable capacitor, the VCO can increases the oscillation frequency outputted thereby, and further the requirement of the higher oscillation frequency is provided.

Figure 2:
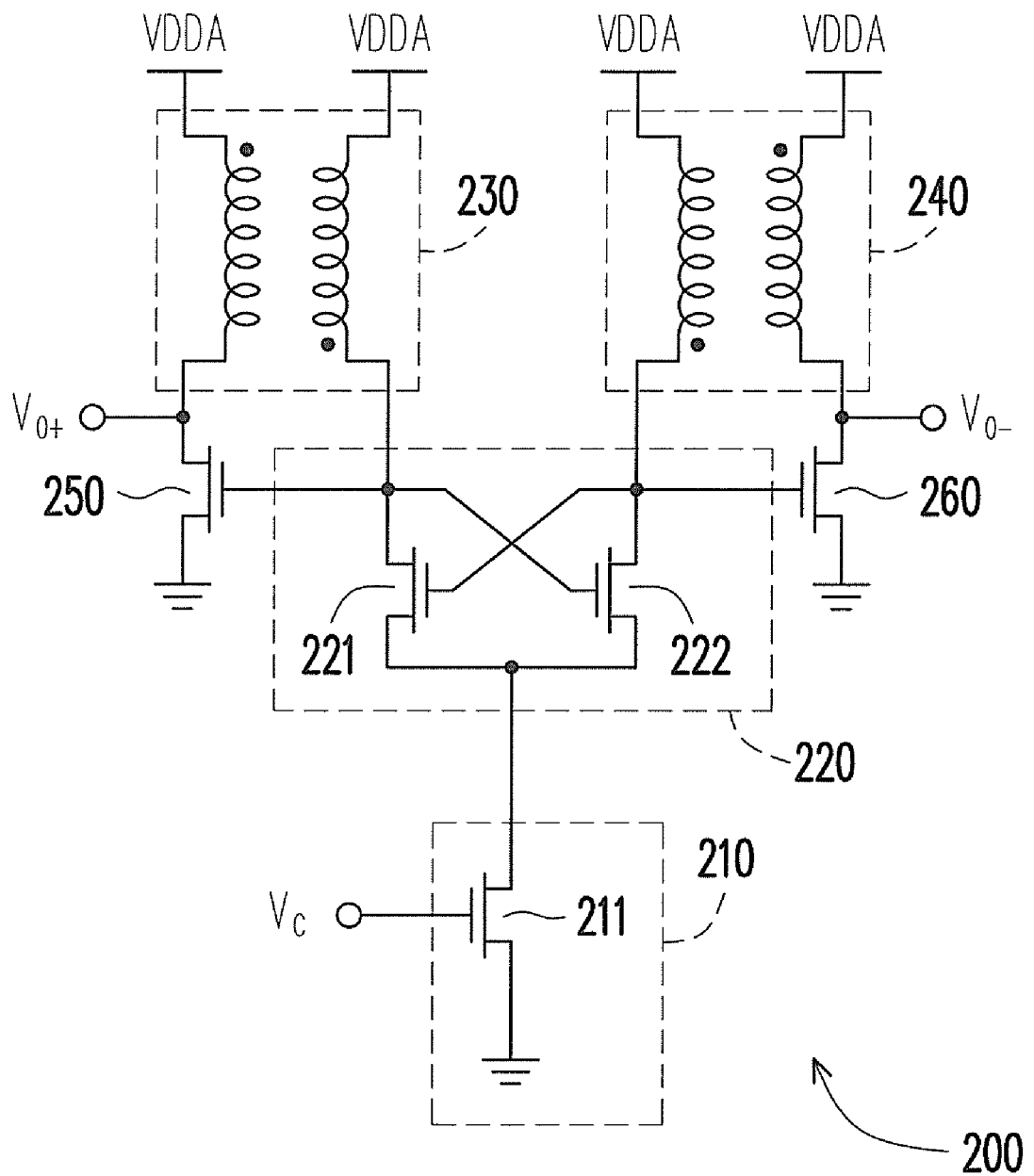
FIG. 2 is a schematic circuit diagram of a VCO according to an embodiment of the invention.

In order to improve the issue related to trade off between the oscillation frequency and the tuning range in the conventional VCO, the variable capacitor is not used in the following embodiments. Instead, by changing the amount of the current of the resonance transistor, the change of the frequency is achieved. FIG. 2 is a schematic circuit diagram of a VCO according to an embodiment of the invention. Referring to FIG. 2, the VCO 200 includes a voltage controlled current source (VCCS) 210, a negative resistance circuit (NRC) 220, a first transformer 230, a second transformer 240, a first transistor 250, and a second transistor 260. In the present embodiment, the transistors 250 and 260 are both NMOS transistors (N-channel metal oxide semiconductor transistors).

The VCCS 210 has a control end and a current end, wherein the control end receives a control voltage Vc. The NRC 220 has a first current path and a second current path. Each of the transformers 230 and 240 has a primary side (a primary winding) and a second side (a second winding). A first end and a second end of the first current path in the NRC 220 are respectively coupled to the current end of the VCCS 210 and the primary side of the transformer 230. A first end and a second end of the second current path in the NRC 220 are respectively coupled to the current end of the VCCS 210 and the primary side of the transformer 240.

In the transformer 230, two ends of the primary side are respectively coupled to the NRC 220 and a first voltage (e.g. the system voltage VDDA) and two ends of the secondary side are respectively coupled to the transistor 250 and the first voltage. In the transformer 240, two ends of the primary side are respectively coupled to the NRC 220 and a first voltage, and two ends of the secondary side are respectively coupled to the transistor 260 and the first voltage.

The secondary sides of the second transformers 230 and 240 respectively serve as a first output end and a second output end of the VCO 200 to provide an output differential pair $V_{O+}$ and $V_{O-}$ having the oscillation frequency $\omega_{osc}$. A first end of the transistor 250 (e.g. the drain) is coupled to the secondary side of the transformer 230, a second end of the transistor 250 (e.g. the source) is coupled to a second voltage (e.g. the ground voltage), and a control end of the first transistor 250 (e.g. the gate) is coupled to the primary side of the transformer 230. A first end of the transistor 260 (e.g. the drain) is coupled to the secondary side of the transformer 240, a second end of the transistor 260 (e.g. the source) is coupled to a second voltage, and a control end of the first transistor 260 (e.g. the gate) is coupled to the primary side of the transformer 240.

FIG. 2 shows an implementation of the NRC 220, but it is not limited thereto. In the present embodiment, the NRC 220 includes a third transistor 221 and a fourth transistor 222. A first end and a second end of the transistor 221 (e.g. the source and the drain) respectively serve as the first end and the second end of the above-described first current path. A first end and a second end of the transistor 222 (e.g. the source and the drain) respectively serve as the first end and the second end of the above-described second current path. The second end of the transistor 222 is coupled to a control end of the transistor 221 (e.g. the gate), and a control end of the transistor 222 (e.g. the gate) is coupled to the second end of the transistor 221.

The VCCS 210 shown in the present embodiment includes a fifth transistor 211. A first end and a control end of the transistor 211 (e.g. the drain and the gate) respectively serves as the current end and the control end of the VCCS 210, and a second end of the transistor 211 is coupled to the second voltage.

By adjusting the control voltage Vc to increase or decrease the current of the VCCS 210, the currents of the primary sides in transformers 230 and 240 can be changed, so as to further affect the currents of the secondary sides therein. By changing the currents of the windings in transformers 230 and 240, the corresponding mutual inductance, i.e. the inductance of the winding, can be changed, so that the tuning range of the VCO 200 is further realized. Moreover, by changing the current through the VCCS 210, the transconductances of the transistors 221 and 222 can be changed.

Figure 3:
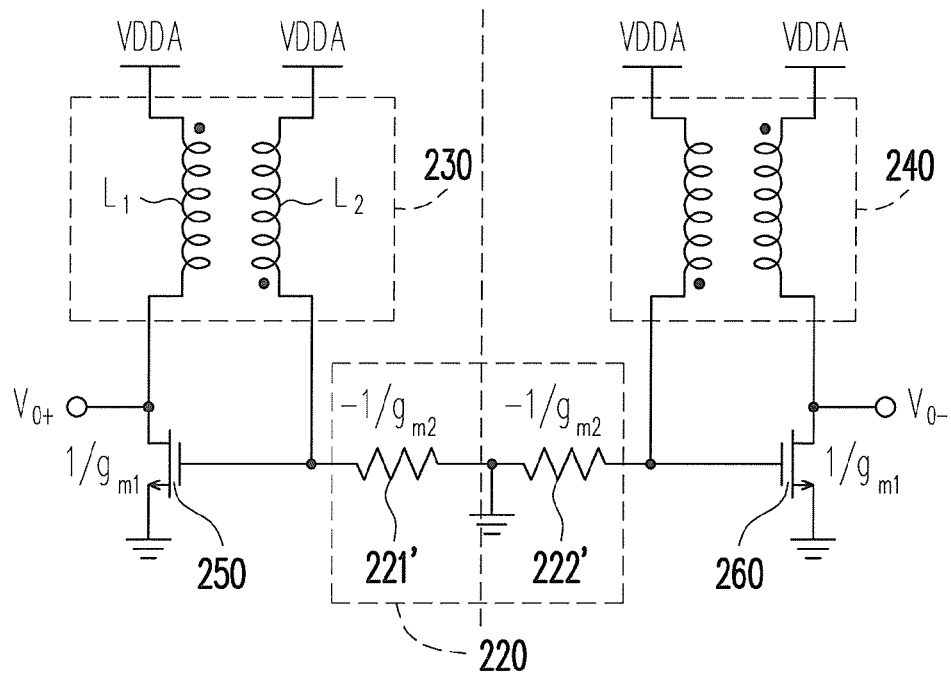
FIG. 3 illustrates the equivalent circuit of the VCO in FIG. 2.

By analyzing the equivalent circuit, the operation of the VCO 200 at the tuning frequency can be realized. FIG. 3 illustrates the equivalent circuit of the VCO 200 in FIG. 2, wherein equivalent resistors 221' and 222' respectively represent the transistors 221 and 222 in the NRC 220. The resistances of the equivalent resistors 221' and 222' are $-1/g_{m2}$, and the equivalent resistances of the transistors 250 and 260 are $1/g_{m1}$. The VCO 220 adopts a symmetrical transformer 230 (and also a symmetrical transformer 240). That is, the inductance $L_1$ of the secondary side and the inductance $L_2$ of the primary side are both L. In order to derive the effect of mutual inductance due to the symmetrical transformer in the VCO 200, the oscillation circuit in the left half of the equivalent circuit shown in FIG. 3 is further re-drawn to an equivalent differential half circuit shown FIG. 4.

Figure 4:
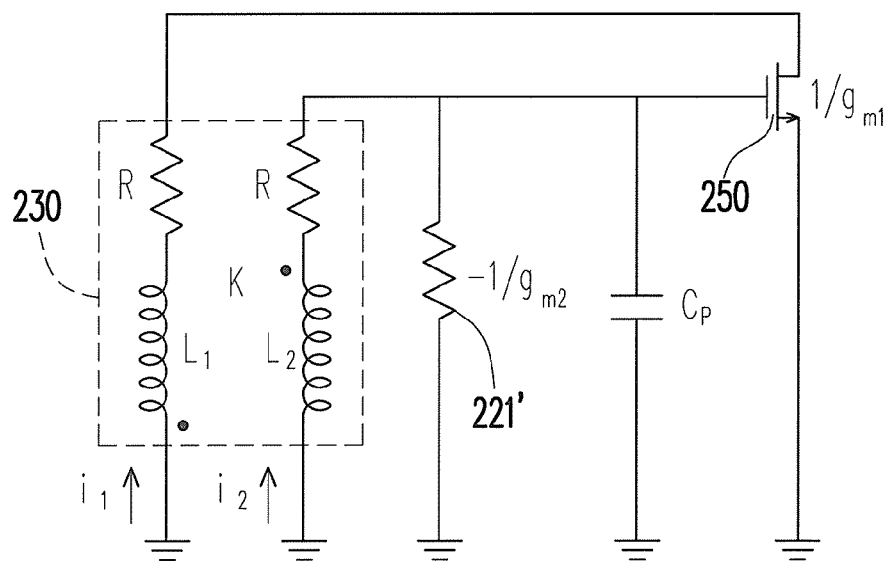
FIG. 4 illustrates an equivalent small signal half circuit of FIG. 3.

FIG. 4 illustrates an equivalent small signal half circuit of FIG. 3, wherein the capacitor Cp represents a parasitic capacitor between the gate of the transistor 250 and the ground voltage. Each of the primary side and the secondary side of the transformer 230 is equivalent to a resistor (resistance R) and an inductor (inductance L), wherein the turn ratio of the primary side and the secondary side is K. The current $I_1$ flowing through the secondary side and the current $I_2$ flowing through the primary side are coupled to each other. Herein, the equivalent circuit shown in FIG. 4 is converted from time domain to s-domain, and the following equations are derived to demonstrate that the VCO can change the oscillation frequency $\omega_{osc}$ by changing the current of the VCCS 210.

In s-domain, the resistance of the parasitic capacitor Cp is $1/sC$, and the resistances of the windings $L_1$ and $L_2$ are both $sL$. Accordingly, the equations 1, 2, and 3 can be derived from the equivalent circuit shown in FIG. 4.

$$(sL + R) \times i_2 - i_1 \times sKL + i_2 \times \left(\frac{1}{sC} // \frac{-1}{gm_2}\right) = 0 \quad \text{(equation 1)}$$

$$i_1 = g_{m1} \times v_{in} \quad \text{(equation 2)}$$

$$v_{in} = i_2 \times \left(\frac{1}{sC} // \frac{-1}{gm_2}\right) \quad \text{(equation 3)}$$

By rearranging the equations 1, 2, and 3, and substituting $j\omega$ for s ($s=j\omega$), the equation 4 is obtained.

$$i_2 \left\{ \left(R - \frac{\omega^2 g_{m1} KLC_{toto} + g_{m2}}{\omega^2 C_{toto}^2 + g_{m2}^2}\right) + j\omega\left(L + \frac{g_{m1}g_{m2}KL - C_{toto}}{\omega^2 C_{toto}^2 + g_{m2}^2}\right)\right\} = 0 \quad \text{(equation 4)}$$

When the circuit oscillates, the imaginary part in the equation 4 must be equal to zero, so that the oscillation frequency $\omega_{osc}$, is obtained as follows.

$$\omega_{osc}^2 = \frac{C - (g_{m1}K + g_{m2})g_{m2}L}{LC^2} \quad \text{(equation 5)}$$

Figure 1:
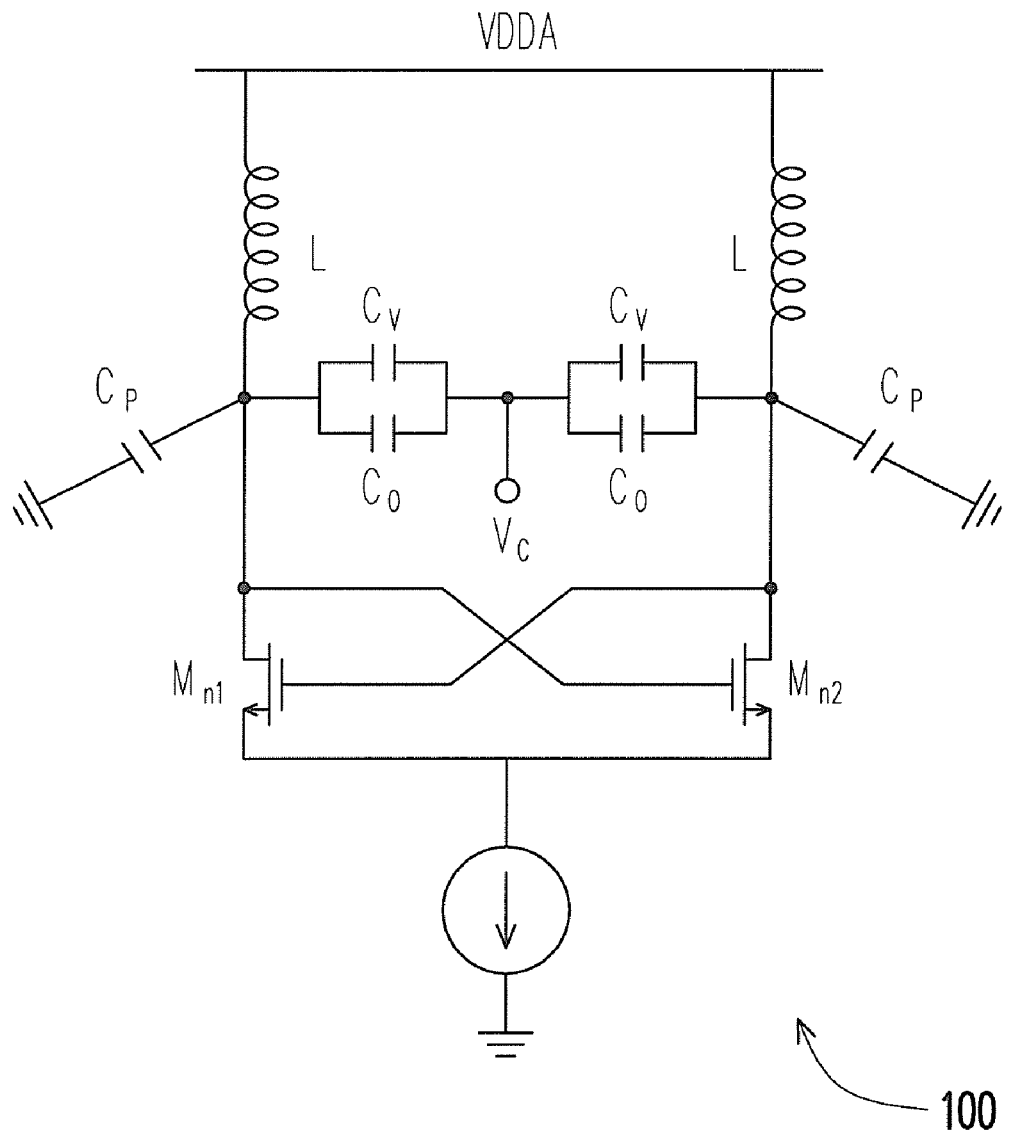
FIG. 1 illustrates a conventional VCO using a NRC.

The oscillation frequency $f_{osc}$ of the conventional VCO 100 as shown in FIG. 1 is simply related to the inductance and the capacitance. The oscillation frequency $\omega_{osc}$, of the VCO 200 in the present embodiment is shown as the equation 5. The equation 5 illustrates that the oscillation frequency $\omega_{osc}$ of the VCO 200 is related to the transconductances of the transistors 221, 222, 250, and 260. It means that once the transconductance can be changed, the operation frequency can be changed correspondingly. The current of the VCCS 210 is changed through the control voltage Vc. Accordingly, the transconductance is correspondingly changed, and further the equivalent inductances of the transformers 230 and 240 are affected. That is, by compensating the transformers 230 and 240 for energy to change the inductance of the resonator, it is achieved to change the frequency. Without the variable capacitor, the oscillation frequency of the resonator can be increased, and further, the requirement of the higher oscillation frequency is provided.

Figure 5:
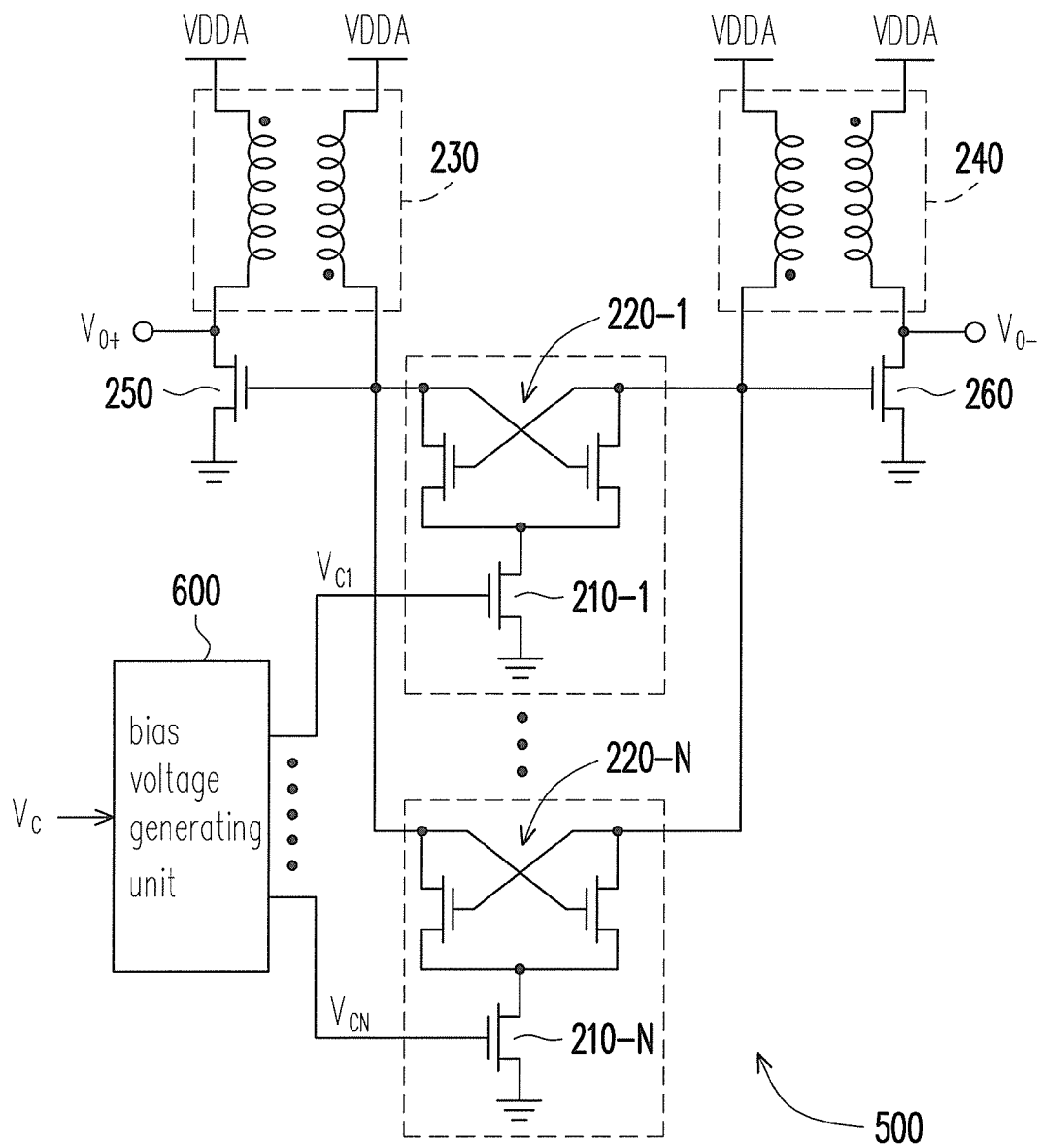
FIG. 5 is a schematic circuit diagram of a VCO according to another embodiment of the invention.

Those who use the above-described embodiment can freely change the VCO 200 based on the requirements of design. FIG. 5 is a schematic circuit diagram of a VCO 500 according to an embodiment of the invention, for example. The VCO 500 is similar to the VCO 200 shown in FIG. 2, and the same contents are not repeated herein. The difference of the VCO 500 from the VCO 200 is that the VCO 500 further includes a plurality of VCCSs and NRCs. FIG. 5 only shows a first VCCS 210-1 and a second VCCS 210-N to represent the plurality of VCCSs, and shows a first NRC 220-1 and a second NRC 220-N to represent the plurality of NRCs.

Each of the first NRC 220-1 and the second NRC 220-N has a first current path and a second current path. In the first NRC 220-1 and the second NRC 220-N, second ends of the first and the second current path are respectively coupled to the primary sides of the first transformer 230 and the second transformer 240. The implementation of the first NRC 220-1 and the second NRC 220-N can be reference to the NRC 200 of the VCO 200.

Each of the first VCCS 210-1 and the second VCCS 210-N has a control end and a current end. The control end of the first VCCS 210-1 receives a first control voltage $V_{C1}$, and the current end of the first VCCS 210-1 is coupled to the first NRC 220-1. The control end of the second VCCS 210-N receives a second control voltage $V_{C2}$, and the current end of the second VCCS 210-N is coupled to the second NRC 220-N. The implementation of the first VCCS 210-1 and the second VCCS 210-N can be reference to the VCCS 210 of the VCO 200.

Figure 6A:
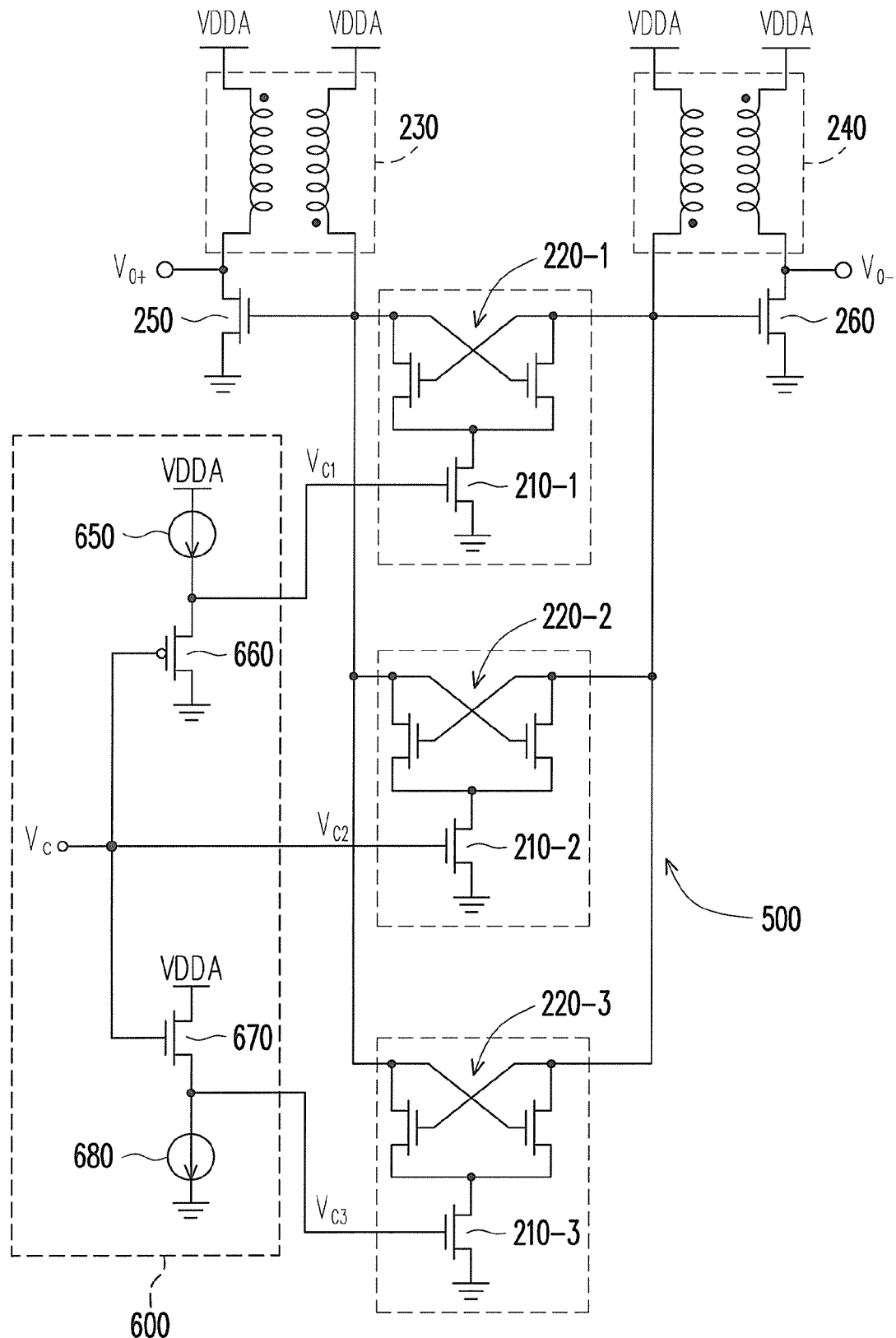
FIG. 6A is a schematic circuit diagram of the bias voltage generating unit according to an embodiment of the invention.

A bias voltage generating unit 600 is coupled to the control ends of the VCCSs 210-1 and 210-N for providing the control voltages $V_{C1}$-$V_{CN}$ to the corresponding VCCSs 210-1-210-N according to the control signal Vc. FIG. 6A is a schematic circuit diagram of the bias voltage generating unit 600 according to an embodiment of the invention. If N is equal to 3, that is, the VCO 500 has three VCCSs 210-1, 210-2, and 210-3, the bias voltage generating unit 600 can provide three control voltages $V_{C1}$, $V_{C2}$, and $V_{C3}$, to control the corresponding VCCSs.

Referring to FIG. 6A, the bias voltage generating unit 600 includes a first current source 680, a sixth transistor 670, a second current source 650, and a seventh transistor 660. A first end and a second end of the seventh transistor 660 are respectively coupled to the second current source 650 and the second voltage (the ground voltage), and a control end of the seventh transistor 660 receives the control signal Vc. Wherein, the first end of the seventh transistor 660 outputs the control voltage $V_{C1}$ to the VCCS 210-1. A first end and a second end of the sixth transistor 670 are respectively coupled to the first voltage (the system voltage VDDA) and the first current source 680, and a control end of the sixth transistor 670 receives the control signal Vc. Wherein, the second end of the sixth transistor 670 outputs the control voltage $V_{C3}$ to the VCCS 210-3. In the present embodiment, the control signal Vc serves as the control voltage $V_{C3}$ and is provided to the VCCS 210-2. The different bias voltages are provided through the bias voltage generating unit 600, and the bias voltages are converted to the corresponding currents respectively through the VCCSs 210-1, 210-2, and 210-3. Accordingly, the VCO 500 changes the oscillation frequency $\omega_{osc}$ through the bias currents.

When the control voltage Vc is 0V, the transistor 660 is turned on, so that the control voltage $V_{C1}$ is obtained by adding the threshold voltage Vt to 0V (i.e. $V_{C1}$=0+Vt). The control voltage $V_{C1}$ is enough to drive the VCCS 210-1. Accordingly, even if the control voltage Vc is 0V, the VCO 500 still works normally. When the control voltage Vc is continuously raised up, the other VCCSs in the VCO 500 sequentially start to provide the bias currents. Accordingly, within the entire range of the control voltage Vc from 0V to the system voltage VDDA, the VCO 500 works normally, so that the tuning range is increased. After be verified, the output frequency of the above VCO 500 changes from 19.5 GHz to 24 GHz, and the tuning range thereof is 4.5 GHz by changing the control voltage Vc.

Figure 6B:
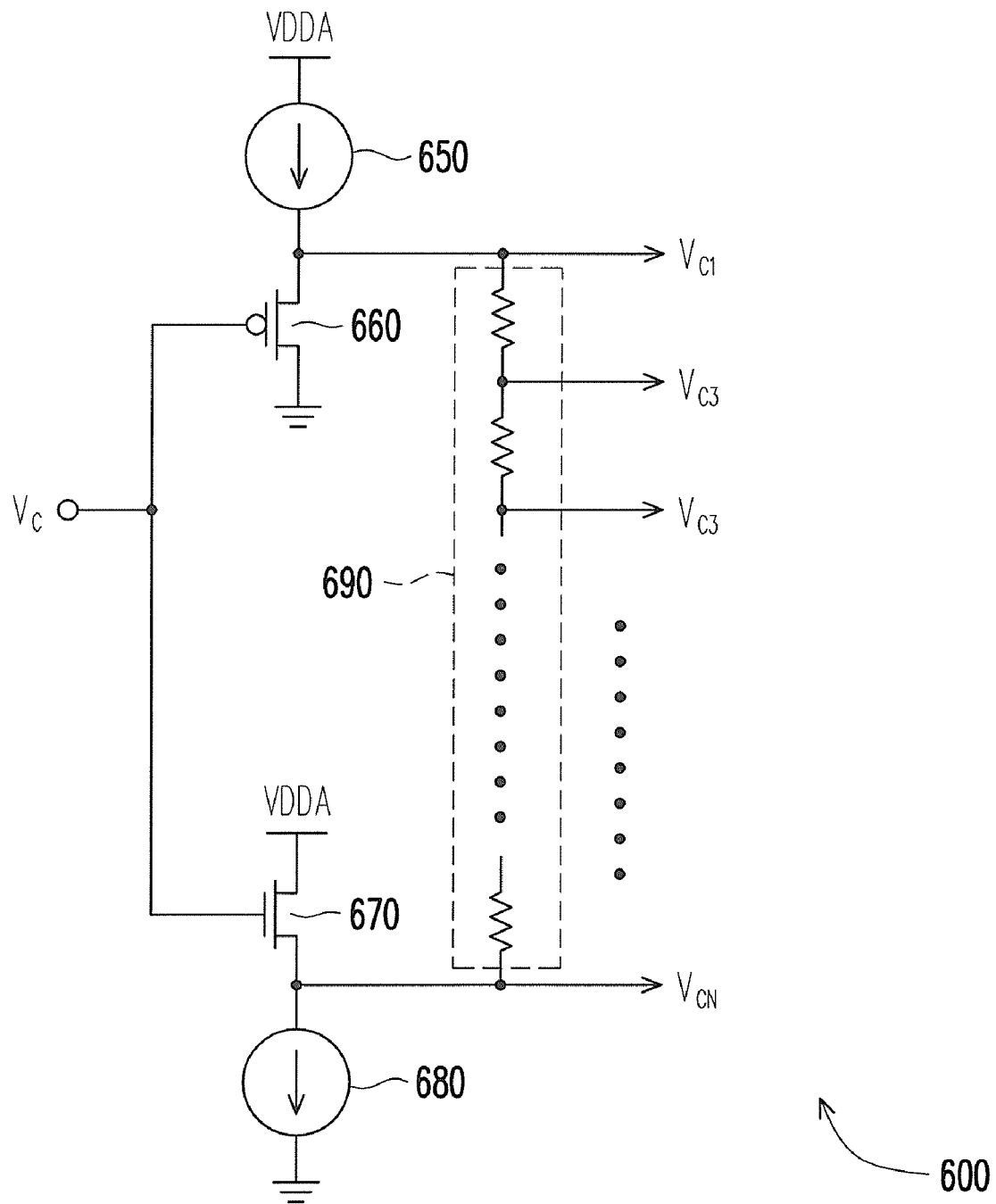
FIG. 6B is a schematic circuit diagram of the bias voltage generating unit according to another embodiment of the invention.

FIG. 6B is a schematic circuit diagram of the bias voltage generating unit 600 according to another embodiment of the invention. The bias voltage generating unit 600 includes a first current source 680, a sixth transistor 670, a second current source 650, and a seventh transistor 660. A first end and a second end of the sixth transistor 670 are respectively coupled to the first voltage (the system voltage VDDA) and the first current source 680, and a control end of the sixth transistor 670 receives the control signal Vc. Wherein, the first end of the sixth transistor 670 outputs the control voltage $V_{CN}$ to the VCCS 210-N. A first end and a second end of the seventh transistor 660 are respectively coupled to the second current source 650 and the second voltage (the ground voltage), and a control end of the seventh transistor 660 receives the control signal Vc. Wherein, the first end of the seventh transistor 660 outputs the control voltage $V_{C1}$ to the VCCS 210-1.

In the present embodiment, the bias voltage generating unit 600 further includes a voltage divider 690. Referring to FIG. 6B, the voltage divider 690 is formed by a plurality of resistors coupled to each other in series. Two ends of the voltage divider 690 are respectively to the first ends of the sixth transistor 670 and the seventh transistor 660. Accordingly, the voltage divider 690 divides the voltage drop across the control voltages $V_{C1}$ and $V_{CN}$ in to one control voltage or a plurality of control voltages. The control voltages obtained by dividing through the voltage divider 690 can be provided to the other VCCSs of the VCO 500 (not shown, but they can be derived from FIG. 5).

Figure 7:
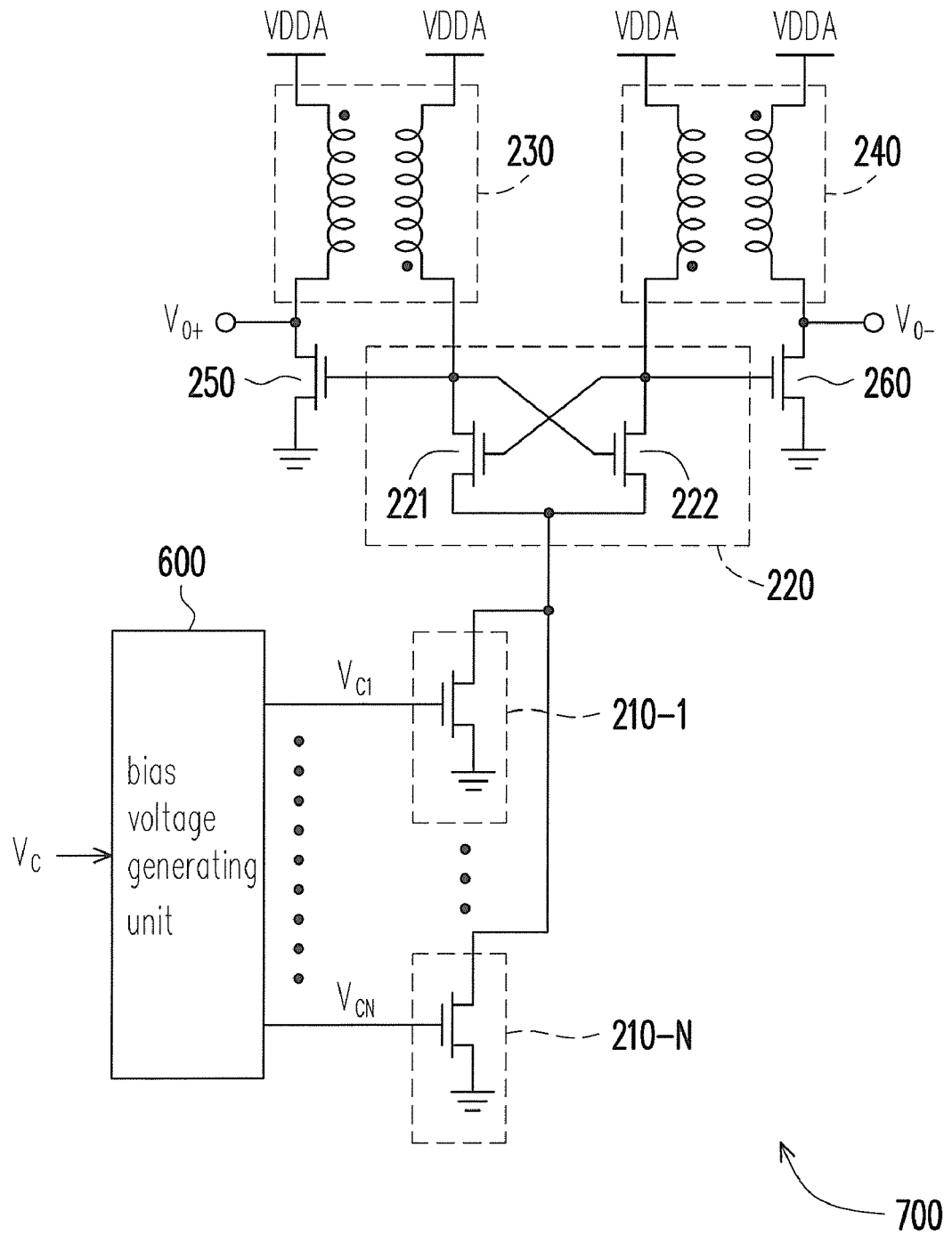
FIG. 7 is a schematic circuit diagram of a VCO according to another embodiment of the invention.

FIG. 7 is a schematic circuit diagram of a VCO 700 according to another embodiment of the invention, for example. The VCO 700 is similar to the VCO 200 shown in FIG. 2 and the VCO 500 shown in FIG. 5, and the same contents are not repeated herein. The difference of the VCO 700 from the VCO 200 is that the VCO 700 further includes a plurality of VCCSs. FIG. 7 only shows a first VCCS 210-1 and a second VCCS 210-N to represent the plurality of VCCSs. The current ends of the VCCSs 210-1 to 210-N are all coupled to the NRC 220. Similar to the VCO 500, the VCO 700 can also provide the bias currents through the VCCSs 210-1-210-N according to the driving of the bias voltage generating unit 600. Accordingly, within the entire range of the control voltage Vc from 0V to the system voltage VDDA, the VCO 700 works normally, so that the tuning range is increased.

In the above embodiments, by adjusting the bias current(s) of the NRC 220 (or the NRCs 220-1-220-N), the oscillation frequency $\omega_{osc}$ is changed. That is, in the above embodiments, by changing the transconductance $g_{m2}$ of the NRC in the equation 5, the oscillation frequency $\omega_{osc}$ is adjusted. In other embodiments, by changing the transconductances $g_{m1}$ of the transistors 250 and 260 in the equation 5, the oscillation frequency $\omega_{osc}$ may be adjusted. Certainly, by simultaneously changing the transconductances $g_{m1}$ and $g_{m2}$ in the equation 5, the oscillation frequency $\omega_{osc}$ may be adjusted. In the following, how the oscillation frequency $\omega_{osc}$ is adjusted by changing the transconductances $g_{m1}$ of the transistors 250 and 260 in the equation 5 is described in FIG. 8 and FIG. 9 as an example.

Figure 8:
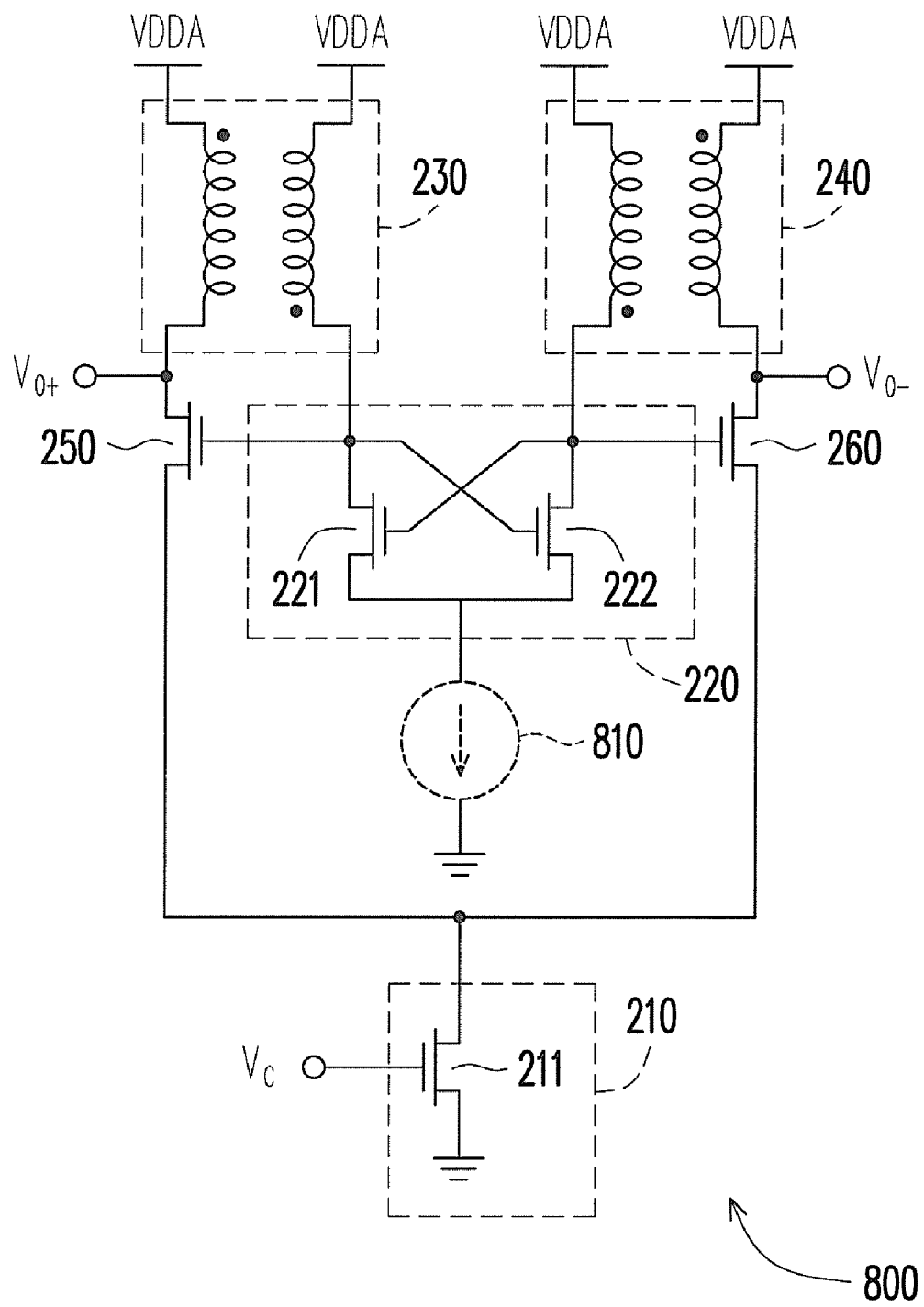
FIG. 8 is a schematic circuit diagram of a VCO according to another embodiment of the invention.

FIG. 8 is a schematic circuit diagram of a VCO 800 according to another embodiment of the invention. The VCO 800 includes the VCCS 210, the NRC 220, the first transformer 230, the second transformer 240, the first transistor 250, the second transistor 260, and a constant current source 810. The VCO 800 is similar to the VCO 200 shown in FIG. 2, and the same contents are not repeated herein. The differences of the VCO 800 from the VCO 200 are the VCCS 210 and the constant current source 810.

Referring to FIG. 8, the constant current source 810 is coupled between the first ends of the first and the second current paths in the NRC 220 and the second voltage (e.g. the ground voltage). Those who use the above-described embodiment can freely omit the constant current source 810 and directly connect the first ends of the first and the second current paths to the ground voltage based on the requirements of design.

The control end of the first VCCS 210 receives the control voltage Vc, and the current end of the first VCCS 210 is coupled to the second ends of the first transistor 250 and the second transistor 260. Through the first VCCS 210, the bias currents in the transistors 250 and 260 are adjusted to change the transconductance $g_{m1}$ in the equation 5, and further, the oscillation frequency $\omega_{osc}$ is adjusted.

Figure 9:
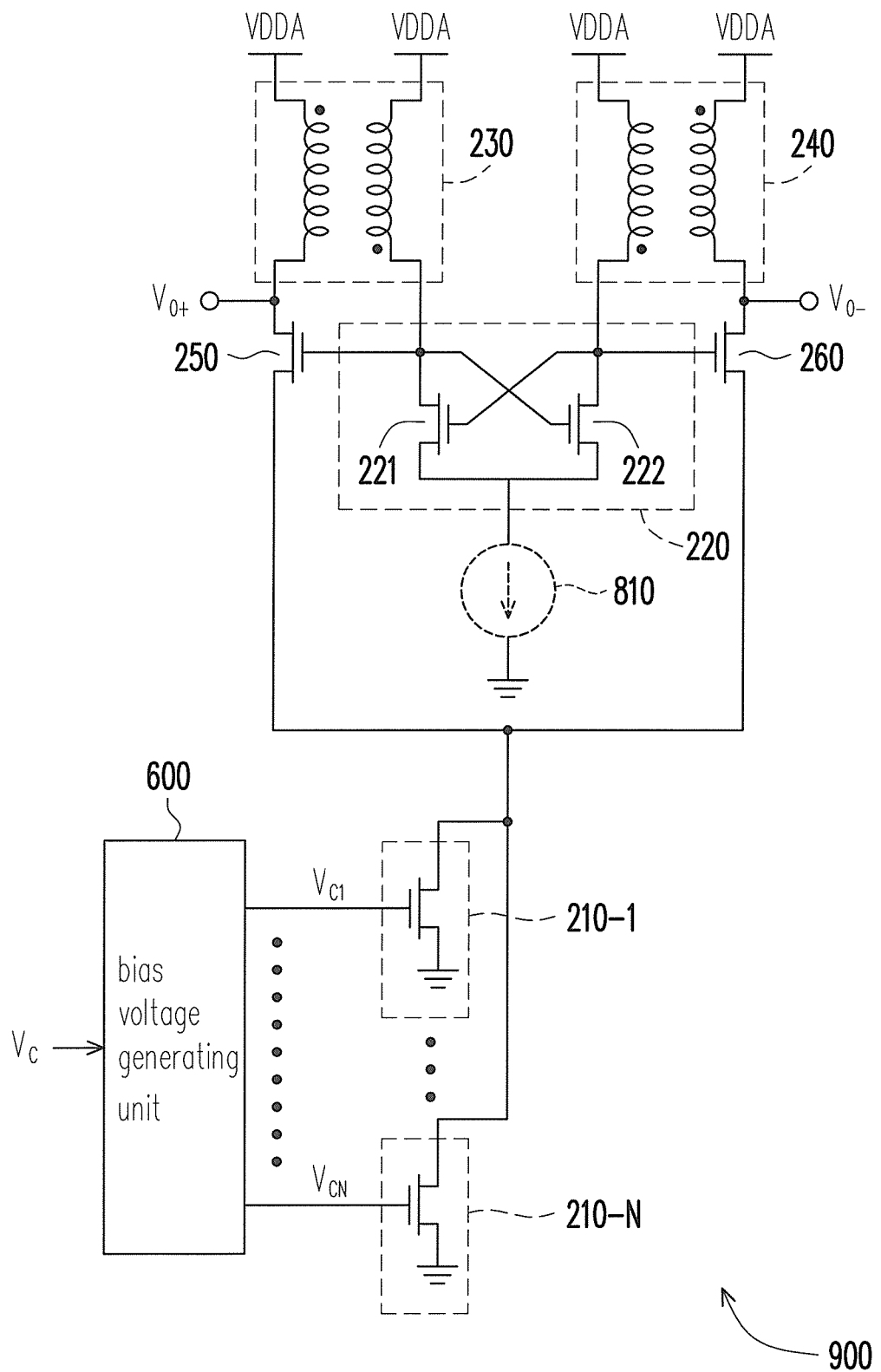
FIG. 9 is a schematic circuit diagram of a VCO according to another embodiment of the invention.

Those who use the above-described embodiment can freely change the VCO 800 based on the requirements of design. FIG. 9 is a schematic circuit diagram of a VCO 900 according to another embodiment of the invention, for example. The VCO 900 is similar to the VCO 800 shown in FIG. 8, and the same contents are not repeated herein. The difference of the VCO 900 from the VCO 800 is that the VCO 900 further includes a plurality of VCCSs. FIG. 9 only shows the first VCCS 210-1 and the second VCCS 210-N to represent the plurality of VCCSs.

The current ends of the VCCSs 210-1-210-N are all coupled to the second ends of the first transistor 250 and the second transistor 260. Similar to the VCO 800, the VCO 900 can also provide the bias currents to the first transistor 250 and the second transistor 260 through the VCCSs 210-1-210-N according to the driving of the bias voltage generating unit 600. Accordingly, within the entire of the control voltage Vc from 0V to the system voltage VDDA, the VCO 900 works normally, so that the tuning range is increased.

To sum up, the above embodiments may be 24-GHz LC-VCOs and can be fabricated in 90 nm CMOS process. The above embodiments may be applied in the system scheme of the high frequency transmitter. Different form the conventional tuning method, the current of the active device is changed through the control voltage in the tuning method of the VCOs in the above embodiments, so that the equivalent mutual inductance of the transformers is affected. That is, by compensating the transformers for energy, the mutual inductance of the resonator is changed, so that it is achieved to change the frequency. Without the variable capacitor, the oscillation frequency of the resonator can be increased, and further, the requirement of the higher oscillation frequency is provided. The symmetrical transformers are used in the VCOs of the above embodiments. When a voltage equal to 1.2 V is supplied, the tuning range (21%) from 19.5 GHz to 24 GHz is provided. When the VCO operates at 24 GHz, the relative phase noise of the VCO is −110 dBc/Hz at 1 MHz offset, and the power consumption of the circuit itself is 10 mW.

Although the present invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed is:

1. A voltage controlled oscillator (VCO), comprising:
   a first voltage controlled current source (VCCS) having a control end and a current end, wherein the control end receives a control voltage;
   a first negative resistance circuit (NRC) having a first current path and a second current path, wherein first ends of the first and the second current paths are coupled to the current end of the first VCCS;
   a first transformer having a primary side and a secondary side, wherein the primary side of the first transformer is coupled to a second end of the first current path of the first NRC, and the secondary side of the first transformer serves as a first output end of the VCO;
   a second transformer having a primary side and a secondary side, wherein the primary side of the second transformer is coupled to a second end of the second current path of the first NRC, and the secondary side of the second transformer serves as a second output end of the VCO;
   a first transistor having a first end coupled to the secondary side of the first transformer, and a control end coupled to the primary side of the first transformer; and
   a second transistor having a first end coupled to the secondary side of the second transformer, and a control end coupled to the primary side of the second transformer; and
   a second VCCS having a control end and a current end, wherein the control end receives a second control voltage; and
   a second NRC having a first current path and a second current path, wherein first ends of the first and the second current paths of the second NRC are coupled to the current end of the second VCCS, and second ends of the first and the second current paths of the second NRC are respectively coupled to the primary sides of the first and the second transformers; and
   a bias voltage generating unit coupled to the control ends of the first and the second VCCs and configured to provide the control voltage and the second control voltage.

2. The VCO as claimed in claim 1, wherein two ends of the primary side of the first transformer are respectively coupled to the second end of the first current path and a first voltage, two ends of the secondary side of the first transformer are respectively coupled to the first end of the first transistor and the first voltage, two ends of the primary side of the second transformer are respectively coupled to the second end of the second current path and the first voltage, and two ends of the secondary side of the second transformer are respectively coupled to the first end of the second transistor and the first voltage.

3. The VCO as claimed in claim 1, wherein second ends of the first transistor and the second transistor are coupled to a second voltage.

4. The VCO as claimed in claim 3, wherein the first voltage is a system voltage, and the second voltage is a ground voltage.

5. The VCO as claimed in claim 1, wherein the first NRC comprises:

a third transistor having a first end and a second end respectively serving as the first end and the second end of the first current path; and
   a fourth transistor having a first end and a second end respectively serving as the first end and the second end of the second current path, wherein the second end and a control end of the fourth transistor are respectively coupled to a control end and the second end of the third transistor.

6. The VCO as claimed in claim 5, wherein the first VCCS comprises a fifth transistor having a first end and a control end respectively serving as the current end and the control end of the first VCCS, and a second end of the fifth transistor is coupled to a second voltage.

7. The VCO as claimed in claim 1, further comprising:
   a second VCCS having a control end and a current end, wherein the control end receives a second control voltage, and the current end of the second VCCS is coupled to the current end of the first VCCS; and
   a bias voltage generating unit coupled to the control ends of the first and the second VCCSs and configured to provide the control voltage and the second control voltage.

8. The VCO as claimed in claim 1, wherein the bias voltage generating unit comprises:
   a first current source;
   a sixth transistor having a first end and a second end respectively coupled to the first current source and a first voltage, and a control end of the sixth transistor receiving the control voltage;
   a second current source; and
   a seventh transistor having a first end and a second end respectively coupled to the second current source and a second voltage, and a control end of the seventh transistor receiving the control voltage.

9. The VCO as claimed in claim 8, wherein the bias voltage generating unit further comprises a voltage divider having two ends respectively coupled to the first ends of the sixth transistor and the seventh transistor.

10. A voltage controlled oscillator (VCO), comprising:
    a first voltage controlled current source (VCCS) having a control end and a current end, wherein the control end receives a control voltage;
    a negative resistance circuit (NRC) having a first current path and a second current path, wherein first ends of the first and the second current paths are coupled to a second voltage;
    a first transformer having a primary side and a secondary side, wherein the primary side of the first transformer is coupled to a second end of the first current path of the NRC, and the secondary side of the first transformer serves as a first output end of the VCO;
    a second transformer having a primary side and a secondary side, wherein the primary side of the second transformer is coupled to a second end of the second current path of the NRC, and the secondary side of the second transformer serves as a second output end of the VCO;
    a first transistor having a first end coupled to the secondary side of the first transformer, a second end coupled to the current end of the first VCCS, and a control end coupled to the primary side of the first transformer; and
    a second transistor having a first end coupled to the secondary side of the second transformer, a second end coupled to the current end of the first VCCS, and a control end coupled to the primary side of the second transformer; and
    a second VCCS having a control end and a current end, wherein the control end receives a second control voltage, and the current end of the second VCCS is coupled to the current end of the first VCCS; and a bias voltage generating unit coupled to the control ends of the first and the second VCCSs and configured to provide the control voltage and the second control voltage.

11. The VCO as claimed in claim 10, wherein two ends of the primary side of the first transformer are respectively coupled to the second end of the first current path and a first voltage, two ends of the secondary side of the first transformer are respectively coupled to the first end of the first transistor and the first voltage, two ends of the primary side of the second transformer are respectively coupled to the second end of the second current path and the first voltage, and two ends of the secondary side of the second transformer are respectively coupled to the first end of the second transistor and the first voltage.

12. The VCO as claimed in claim 11, wherein the first voltage is a system voltage, and the second voltage is a ground voltage.

13. The VCO as claimed in claim 10, further comprising a constant current source, wherein the constant current source is coupled between the first ends of the first and the second current paths and the second voltage.

14. The VCO as claimed in claim 10, wherein the first NRC comprises:
 a third transistor having a first end and a second end respectively serving as the first end and the second end of the first current path; and
 a fourth transistor having a first end and a second end respectively serving as the first end and the second end of the second current path, wherein the second end and a control end of the fourth transistor are respectively coupled to a control end and the second end of the third transistor.

15. The VCO as claimed in claim 14, wherein the first VCCS comprises a fifth transistor having a first end and a control end respectively serving as the current end and the control end of the first VCCS, and a second end of the fifth transistor is coupled to the second voltage.

16. The VCO as claimed in claim 10, wherein the bias voltage generating unit comprises:
 a first current source;
 a sixth transistor having a first end and a second end respectively coupled to the first current source and a first voltage, and a control end of the sixth transistor receiving a control signal;
 a second current source; and
 a seventh transistor having a first end and a second end respectively coupled to the second current source and a second voltage, and a control end of the seventh transistor receiving the control signal.

17. The VCO as claimed in claim 16, wherein the bias voltage generating unit further comprises a voltage divider having two ends respectively coupled to the first ends of the sixth transistor and the seventh transistor.

* * * * *